(12) United States Patent
Bhosale

(10) Patent No.: US 7,638,758 B2
(45) Date of Patent: Dec. 29, 2009

(54) ELECTRONIC PACKAGE INCORPORATING ELECTRONIC COMPONENTS GENERATING AND/OR RECEIVING LIGHT-BASED CODED SIGNALS

(75) Inventor: Rohit Bhosale, Landshut (DE)

(73) Assignee: Schott AG, Mainz (DE)

( * ) Notice: Subject to any disclaimer, the term of this patent is extended or adjusted under 35 U.S.C. 154(b) by 0 days.

(21) Appl. No.: 11/188,546

(22) Filed: Jul. 25, 2005

(65) Prior Publication Data

US 2006/0027731 A1 Feb. 9, 2006

(30) Foreign Application Priority Data

Jul. 29, 2004 (EP) .................. 04017977
Apr. 29, 2005 (EP) .................. 05009463

(51) Int. Cl.
*H01J 5/02* (2006.01)
*H01J 40/14* (2006.01)

(52) U.S. Cl. .................. 250/239; 257/686
(58) Field of Classification Search .............. 250/239; 257/686
See application file for complete search history.

(56) References Cited

U.S. PATENT DOCUMENTS

| | | | |
|---|---|---|---|
| 3,973,118 A * | 8/1976 | LaMontagne | 250/226 |
| 4,346,294 A * | 8/1982 | Albaugh et al. | 250/227.24 |
| 5,296,724 A | 3/1994 | Ogata et al. | |
| 5,373,519 A * | 12/1994 | Siono et al. | 372/50.11 |
| 5,377,177 A * | 12/1994 | Horinouchi et al. | 369/112.1 |
| 5,543,958 A * | 8/1996 | Lebby et al. | 359/254 |
| 5,825,054 A | 10/1998 | Lee et al. | |
| 5,838,703 A * | 11/1998 | Lebby et al. | 372/50.21 |
| 5,995,476 A * | 11/1999 | Kim | 369/112.1 |
| 6,031,856 A | 2/2000 | Wu et al. | |
| 7,061,949 B1* | 6/2006 | Zhou et al. | 372/36 |
| 2004/0020676 A1* | 2/2004 | Stark | 174/52.4 |
| 2004/0211892 A1* | 10/2004 | Stallard et al. | 250/239 |
| 2006/0002667 A1* | 1/2006 | Aronson | 385/93 |
| 2006/0279955 A1* | 12/2006 | Kettunen et al. | 362/362 |

FOREIGN PATENT DOCUMENTS

| | | |
|---|---|---|
| CN | 2255682 | 6/1997 |
| GB | 2 360 656 A | 9/2001 |
| JP | 63 038272 A | 2/1988 |
| JP | 11038152 A * | 2/1999 |
| WO | WO 01/84201 A2 * | 8/2001 |

* cited by examiner

*Primary Examiner*—Seung C Sohn
(74) *Attorney, Agent, or Firm*—Michael J. Striker

(57) ABSTRACT

The electronic package contains an electronic component or components generating and/or receiving light-based signals, an optical element or elements for transceiving the signals and a housing encapsulating the electronic component or components. According to the invention the optical elements for transceiving the signals are diffractive/refractive optical elements (D/ROEs), which are also part of a sealing device for the housing. Accordingly, the diffractive/refractive optical elements (D/ROEs) have both optical and sealing functions.

9 Claims, 2 Drawing Sheets

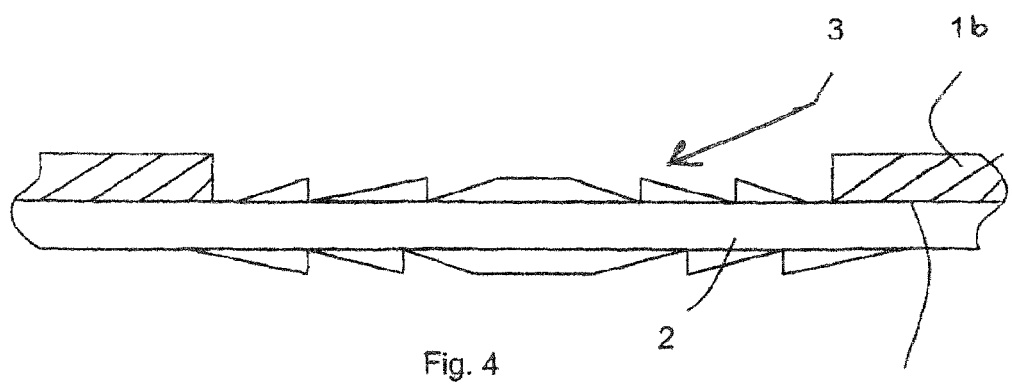
Fig. 4
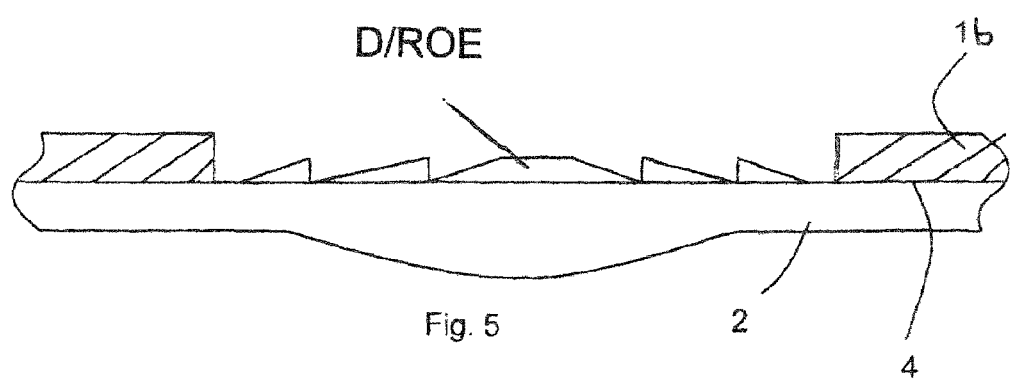
D/ROE
Fig. 5
Fig. 6a     Fig. 6b
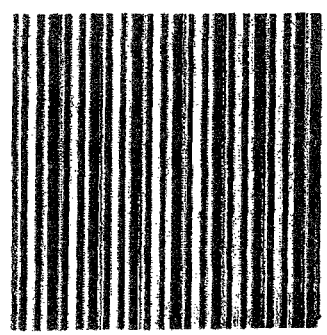 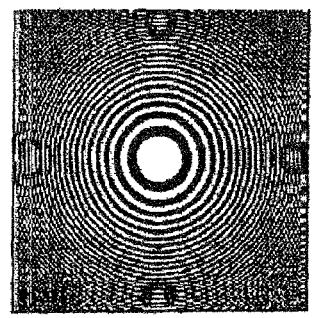
Fig. 6c
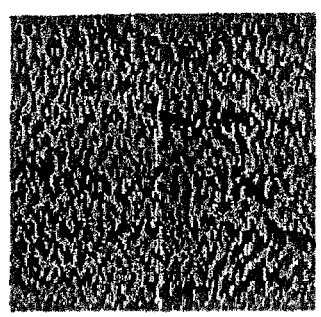

ELECTRONIC PACKAGE INCORPORATING ELECTRONIC COMPONENTS GENERATING AND/OR RECEIVING LIGHT-BASED CODED SIGNALS

BACKGROUND OF THE INVENTION

1. Field of the Invention

The invention relates to an electronic package incorporating electronic components generating and/or receiving light-based (visible or invisible) signals and optical elements.

2. Related Art

The pattern within the last couple of years, for example for transistor packages irrespective of the TO header has been the use of window caps with Optical Sub Assembly (OSA), which has been improved by the use of ball lens caps in different materials like glass, sapphire, quartz, silicon etc. suiting the requirements. The next stage of performance improvement was achieved by using aspheric lenses, which eliminated the linear aberration of the focus limitation of ball lenses. All the optical materials were conveniently coated with different coatings serving the applications, for instance antireflective coating, beam splitter etc.

All the optical elements in such TO caps have been traditionally sealed by different sealing processes into metal caps, which were either machined, deep-drawn or manufactured by a similar manufacturing method. Other non-metallic materials like ceramics are also useable based upon their application, for example, in Hybrid packages. Sealing methods vary from user to user and can be glass-to-metal sealing, metallizing, soldering or any other process, which seals or glues the optical element to the cap or the hybrid housing. The cap can be made out of any material, such as metal, ceramic, plastic etc.

The cap with the optical element is mounted on, e.g. a transistor outline header or a hybrid package with optical window, both of which have an active or passive device needing packaging, and is sealed by a suitable method. The optical element acts as an important part of the current assembly, since in operation it functions to correctly channel the output of the device. The same applies for devices receiving light signals. The package could be hermetic, semi-hermetic or non-hermetic according to the requirements of the particular application.

Consideration is drawn to the packaging of a laser device for a transceiver application, in which a laser device is mounted on a TO header along with other required electronics. This laser device would require a hermetic packaging for longer lasting life along with optimal performance. The package is required to bring in electrical connections and feed the optical output from the device into a coupling object or device.

In most cases after the assembly of the device on the TO header is completed a TO cap with an optical element such as a ball lens is used. The ball lens is used to channel the output of the laser device into a fiber. The ball lens is usually sealed in the metal cap with glass solder or glass frit. This TO cap after assembly is then sealed onto the TO header with any suitable method, e.g. by seam welding or projection welding. Once the complete assembly of header and cap is finished, the device is started electrically and the output of the laser and an OSA is channeled into a fiber.

Such an electronic package is known from GB 2 360 656 A. This document discloses a transceiver using diffractive optical elements to direct the beams. The transceiver includes a transmitter for outputting a plurality of beams of electromagnetic energy. The transmitter is a vertical cavity surface emitting laser. An arrangement of diffractive optical elements (DOE's) directs a plurality of beams output by the transmitter to a detector. Preferably the optical elements are fabricated by imprinting a pattern high temperature film substrate using an ultraviolet epoxy. The use of a vertical cavity surface emitting laser is supposed to allow for high data rates while the diffractive optical element allows for a compact design. However, the design of the transceiver is still quite complicated and thus expensive. Nowadays requirements, however, are to manufacture electronic packages as cost-effectively as possible with the highest quality.

SUMMARY OF THE INVENTION

Accordingly it is an object of the present invention to provide an electronic package incorporating at least one electronic component generating and/or receiving light-based signals and at least one optical element for transceiving the light-based signals, which overcomes the above-mentioned disadvantages of the heretofore known electronic packages of this general type, and which can be produced with low costs.

With the foregoing and other objects in view there is provided in accordance with the invention an electronic package of the above described type, wherein the at least one optical element for transceiving the light-based signals is at least one diffractive/refractive optical element (D/ROE), or at least one array of diffractive/refractive optical elements, which are part of a means for sealing-off or sealing the housing of the electronic package. The diffractive/refractive optical elements could be as simple as concentric rings or as complicated as arrays of diffractive optical structures. They could also be holographic patterns, which are all generated with a computer-assisted method or computer program. Other combinations of refractive and diffractive lenses are possible to generate the desired performance.

The key feature of the invention is the double-function of the diffractive/refractive optical elements (D/ROEs). The D/ROEs not only provide excellent optical characteristics but they also are part of a means for sealing the housing. The sealing techniques or methods can remain the same as in the prior art, but any other suitable methods can also be implemented. The improvement provides increased efficiency and cost savings. Using diffractive/refractive optical elements different patterns, geometries can be created on one side or both sides of an optical glass disk, plano-convex, plano-concave or any other lens for beam pointing or collimation. Other optical applications are possible. In the case of beam pointing the invention is advantageous as it can potentially replace ball lenses used in the prior art packages. D/ROEs can be utilized to create structures on a substrate of any material, which forms an aspheric lens, ball lens or any other optic element. These structures can be made by any of the standard microstructuring process or any other processes established for creating microstructures. Examples include glass microstructuring on glass or silicon, silicon microstructures on silicon using lithography or hot embossing or any other suitable process. The structuring process can be accomplished individually or on a wafer scale. Wafer-scale production of such structures is preferred, since it helps to bring costs down. Also, by using this process on a wafer scale the step of inspecting the structures can also be performed prior to dicing along with marking for bad structures, thus increasing the yield. The structures can be cut into individual disks or any other shape with an appropriate separation method. These individual structured substrates can then be sealed into a cap of the electronic package for further use by glass-to-metal sealing, solder sealing or other appropriate sealing techniques to create a hermetic or semi-hermetic seal. According to a preferred embodiment of the invention the diffractive/refractive optical element (D/RGEs) is placed within a cap or housing and fixed over and/or in a window of the cap or housing of the electronic package. The D/ROE plays its role as part of the means for sealing-off the package in so far as its dimensions can be chosen in such a way that the sealing area of the D/ROE against the cap of the package is extremely enlarged in comparison to that of the prior art embodiments, in which a ball lens is to be placed and sealed in a window in the cap.

As mentioned above, if the cap is a metal cap the diffractive/refractive optical element is preferably fixed to it and over and/or in the window by means of a glass-to-metal seal or sealing technique (GTMS).

The present invention also includes a method of sealing a housing, or a cap of the housing of an electronic package incorporating electronic components generating and/or receiving light-based signals, in which a diffractive/refractive optical element is used as a sealing member for sealing the housing or the cap. The diffractive/refractive optical elements thus have two functions, as excellent optical components and as parts of a sealing device for the electronic package, which has not been done prior to the present invention.

BRIEF DESCRIPTION OF THE DRAWINGS

The objects, features and advantages of the invention will now be illustrated in more detail in comparison to the known standard TO cap, with reference to the accompanying figures in which:

FIG. 4 is a detailed view of an optical element with a diffractive optical element on both sides of it;

FIG. 5 is a detailed view of a combined optical element comprising a diffractive optical element and refractive optical element; and FIGS. 6a, 6b and 6c are respective different diffractive optical elements.

DESCRIPTION OF THE PREFERRED EMBODIMENTS

Figure 1:
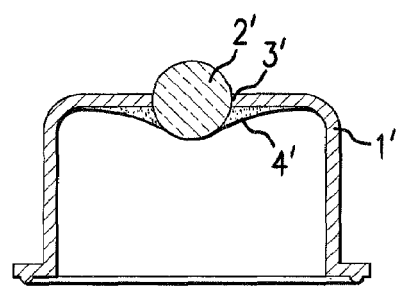
FIG. 1 is a diagrammatic cross-sectional view of a prior art TO cap with a ball lens acting as optical element.

Referring now to FIG. 1 a conventional TO cap 1' is shown with a window 3'. An optical element 2', in the illustrated embodiment a ball lens, is located in the window 3'. The cap 1' is sealed off by a glass-to-metal seal 4'. Manufacturing of seal 4' is quite complicated according to the prior art. Furthermore an optical element 2' in the form of a ball lens is quite expensive.

Figure 2:
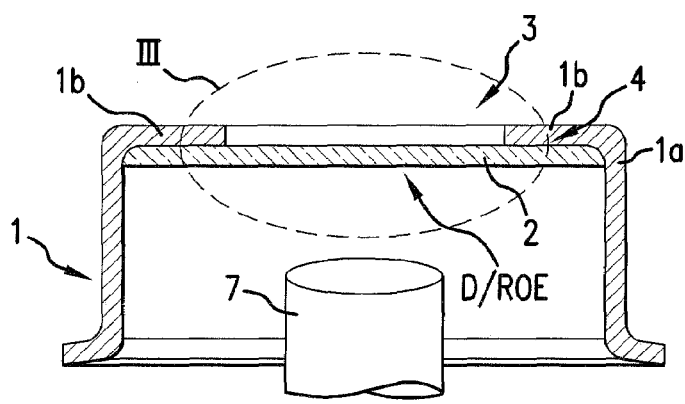
FIG. 2 is a similar cross-sectional view of an embodiment of a TO cap according to the present invention.

Attention is now drawn to FIG. 2, which is a diagrammatic cross-sectional view of an embodiment of a TO cap 1a of an electronic package according to the present invention. The TO cap 1a is in one piece, i.e. is not composed of separate parts that are bonded or joined together. The TO cap 1a is part of the sealing-off housing 1 of the electronic package. As in the prior art embodiment shown in FIG. 1 the TO cap 1a has a window 3, which is sealed off by a diffractive/refractive optical element (D/ROE) 2, which is placed within the TO cap 1a. The TO cap 1 shown in FIG. 2 comprises a bottom 1b. As is apparent from the diagrammatic view in FIG. 2, the sealing area 4 between the D/ROE and the inner surface of the bottom 1b of the cap 1a is much larger than that of the prior art embodiment D/ROE 2 is simply set into the bottom 1b of cap 1a and the sealing area of the optical element 2 and the entire inner surface of the bottom 1b of the cap 1a, which contacts it, are sealed to each other using any suitable method.

The electronic component 7 can include a laser device and is shown extending into the cap a1 in FIG. 2. It can be mounted on a TO header, which is not shown in FIG. 2, in which case the housing 1 comprises the TO header and the TO cap 1a.

Figure 3:
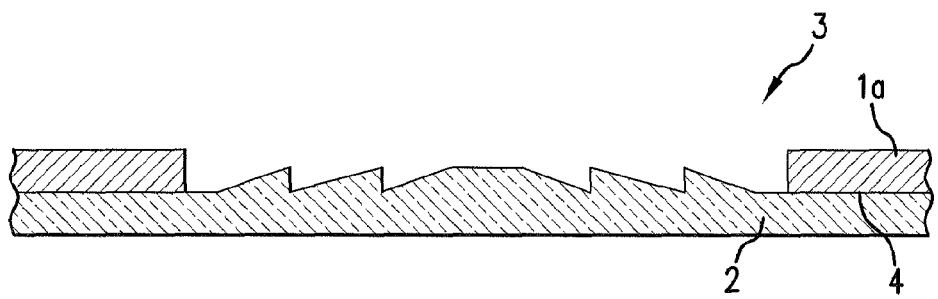
FIG. 3 is a detailed view of an optical element with a diffractive optical element from the dashed circle III in FIG. 2.

Turning now to FIG. 3, a detailed view of an exemplary optical element 2 is shown covering and sealing a window 3 in the TO cap 1a with sealing area 4. In FIG. 3 the optical element 2 is a one-sided diffractive optical element.

FIG. 4 shows an embodiment that is similar to that shown in FIG. 3. However in the case of the embodiment of FIG. 4 the optical element 2 is a two-sided diffractive optical element.

FIG. 5 is a detailed view of another embodiment of the optical element 2. This optical element 2 has on one side, in FIG. 5 the upper side, diffractive structures and on the other side a refractive optical element. Accordingly, the optical element 2 according to the embodiment of FIG. 5 incorporates a combination of diffractive and refractive elements (D/ROE).

Finally FIGS. 6a, 6b and 6c show different types of diffractive optical elements. In FIG. 6a a linear optical element is shown, whereas in FIG. 6b a circular optical element is shown. In FIG. 6c an exemplary computer generated hologram is shown, which might form a diffractive optical element on the upper or on the lower side of the optical element 2.

The present invention provides electronic packages and the use of D/ROEs in such packages in order to create a hermetic, semi-hermetic or quasi-hermetic bond between the substrate or the carrier of the structure and the carrier of the optical element, which in most cases are metal cans or caps, in packaging technologies, for example in transistor packages, hybrid packages or ceramic packages, or similar techniques requiring optical elements with this sort of bond along with the required optical functions to optimize production.

The disclosures in European Patent Applications 04 017 977.2 and 05 009 463.0 of Jul. 29, 2004 and Apr. 29, 2005 respectively are incorporated here by reference. These German Patent Applications describe the invention described hereinabove and claimed in the claims appended hereinbelow and provides the basis for a claim of priority for the instant invention under 35 U.S.C. 119.

While the invention has been illustrated and described as embodied in an electronic package incorporating electronic components generating and/or receiving light-based coded signals, it is not intended to be limited to the details shown, since various modifications and changes may be made without departing in any way from the spirit of the present invention.

Without further analysis, the foregoing will so fully reveal the gist of the present invention that others can, by applying current knowledge, readily adapt it for various applications without omitting features that, from the standpoint of prior art, fairly constitute essential characteristics of the generic or specific aspects of this invention.

What is claimed is new and is set forth in the following appended claims.

I claim:

1. An electronic package comprising:

a sealing-off housing (1) comprising a cap (1a), said cap (1a) being provided with at least one window (3), said cap (1*a*) being in one piece and said cap (1*a*) having an inner surface and a bottom (1*b*);

at least one transceiver device (7) for generating light-based signals, said at least one transceiver device being arranged in said sealing-off housing (1) so that said light-based signals pass through said at least one window (3); and an optical element (2) extending over said at least one window and at least a portion of said inner surface of said cap (1*a*), wherein said portion of said inner surface of said cap (1*a*) contacts and is sealed with a sealing area (4) of said optical element;

wherein said optical element comprises diffractive and refractive elements arranged in said optical element so that said light-based signals pass through said diffractive and refractive elements and said optical element seals off said at least one window; and wherein said portion of said inner surface of said cap (1*a*) that contacts said sealing area (4) of said optical element is an entire inner surface of said bottom (1*b*) of said cap (1*a*).

2. The electronic package as defined in claim 1, wherein said optical element has a planoconvex, plano-concave, or planar optical structure.

3. The electronic package as defined in claim 1, wherein the optical element (2) is structured to act as a beam pointer.

4. The electronic package as defined in claim 1, wherein the optical element (2) is structured to act as a beam collimator.

5. The electronic package as defined in claim 1, wherein the housing (1) is made out of metal and the optical element (2) is sealed over the at least one window (3) by a glass-to-metal-seal (GTMS) between the sealing area (4) of the optical element and the inner surface of the housing.

6. In a sealed electronic package comprising a transistor outline header, at least one transceiver device for generating light-based signals mounted on said transistor outline header, a transistor outline cap in one piece, having a bottom provided with a window and mounted on said transistor outline header over said at least one transceiver device so that said light-based signals pass through said window, the improvement comprising an optical element extending over a portion of an inner surface of said cap adjacent said window and over said window so that said light-based signals pass through said window, and wherein said portion of said inner surface of said cap is sealed with a sealing area (4) of said optical element, said portion of said inner surface of said cap (1*a*) that contacts said sealing area (4) is an entire inner surface of said bottom (1*b*) of said cap (1*a*), and said optical element comprises diffractive and refractive elements arranged in said optical element so that said light-based signals pass through said diffractive and refractive elements.

7. An electronic package comprising:

a metal housing (1) comprising a cap (1*a*), said cap (1*a*) being provided with at least one window (3), said cap (1*a*) being in one piece and said cap (1*a*) having an inner surface and a bottom (1*b*);

at least one transceiver device (7) for generating light-based signals, said at least one transceiver device being arranged in said sealing-off housing (1) so that said light-based signals pass through said at least one window (3); and a glass optical element (2) extending over said at least one window and at least a portion of said inner surface of said cap (1*a*), wherein said portion of said inner surface of said cap (1*a*) contacts and is sealed with a sealing area (4) of said glass optical element by a glass-to-metal seal (GTMS);

wherein said glass optical element comprises diffractive and refractive elements arranged in said glass optical element so that said light-based signals pass through said diffractive and refractive elements and said optical element seals off said at least one window; and wherein said portion of said inner surface of said cap (1*a*) that contacts said sealing area (4) of said glass optical element is an entire inner surface of said bottom (1*b*) of said cap (1*a*).

8. The electronic package as defined in claim 7, wherein said glass optical element (2) has a special optical coating, whereby said glass optical element acts as a beam splitter.

9. A method of sealing off a housing (1) for encapsulating at least one electronic component (7) for generating and/or receiving light-based signals, said housing (1) comprising a cap (1*a*), said cap (1*a*) including a bottom (1*b*) provided with a window and said cap (1*a*) being in one piece, said method comprising sealing said housing with said at least one electronic component (7) therein by a sealing means comprising at least one optical element for transceiving the light-based signals; wherein said at least one optical element is at least one diffractive/refractive optical element (D/ROEs) or diffractive/refractive optical element array;

wherein an entire inner surface of said bottom (1*b*) of said cap (1*a*) contacts and is sealed with a sealing area (4) of said optical element, so that said optical element extends over and closes said window inside of said cap, whereby said housing is sealed.

\* \* \* \* \*